United States Patent [19]

Lehovec

[11] 4,242,595
[45] Dec. 30, 1980

[54] TUNNEL DIODE LOAD FOR ULTRA-FAST LOW POWER SWITCHING CIRCUITS

[75] Inventor: Kurt Lehovec, Los Angeles, Calif.

[73] Assignee: University of Southern California, Los Angeles, Calif.

[21] Appl. No.: 928,543

[22] Filed: Jul. 27, 1978

[51] Int. Cl.³ .............. H03K 19/094; H03K 3/315; H03K 3/42; H01L 29/80
[52] U.S. Cl. .................................. 307/205; 307/213; 307/286; 307/311; 307/322; 357/15; 357/22; 357/30
[58] Field of Search .............. 307/213, 206, 286, 311, 307/322, 205

[56] References Cited

U.S. PATENT DOCUMENTS

| | | | |
|---|---|---|---|
| 3,175,097 | 3/1965 | Lewin | 307/206 |
| 3,235,754 | 2/1966 | Buelow et al. | 307/213 X |
| 3,239,695 | 3/1966 | Neff et al. | 307/286 |
| 3,239,775 | 3/1966 | Putterman | 307/286 X |
| 3,248,563 | 4/1966 | Lin | 307/206 |
| 3,253,165 | 5/1966 | Cornish | 307/206 |
| 3,319,080 | 5/1967 | Cornely et al. | 307/206 X |
| 3,400,280 | 9/1968 | Lettieri | 307/286 X |
| 3,558,913 | 1/1971 | Hatley | 307/206 |
| 3,648,068 | 3/1972 | Nakaya | 307/362 X |
| 3,986,195 | 10/1976 | Arai | 307/311 X |

OTHER PUBLICATIONS

Liechti, "GaAs FET Logic", Conf.: Proc. of 6th Int'l Symposium on GaAs & Related Cmpnds, (9/20-22/76), pp. 227-236.

Becker, "A Simple Light-sensitive Semiconductor Trigger Device", *Exp. Tech. Phys.* (Germany), vol. 23, No. 5, pp. 555-558, 1975.

Van Tuyl et al., "High-Speed Integrated Logic with GaAs MESFETS", *IEEE-JSSC*, vol. SC-9, No. 5, pp. 269-276, 10/1974.

Zuleeg et al., *IEEE Trans. on Electron Devices*, vol. ED-25, No. 6, pp. 628-639, 6/1978.

*Primary Examiner*—Larry N. Anagnos

[57] ABSTRACT

An active multi-terminal switching device such as a transistor in electric series connection with a tunnel diode load discharges, or charges, the output node between tunnel diode and transistor upon activating, or deactivating, the transistor by appropriate input signals. The negative current-voltage characteristics of the forward biased tunnel diode provides a large load resistance, and thus causes a low current level, during the stationary on-state of the transistor, but it also provides a small load resistance during most of the transient when the transistor is turned off, and thus causes a fast switching speed. A tunnel diode connected between gate and source of an enhancement mode n-channel GaAs junction field effect phototransistor enhances the recovery of the transistor after the activating light beam is switched off.

13 Claims, 8 Drawing Figures

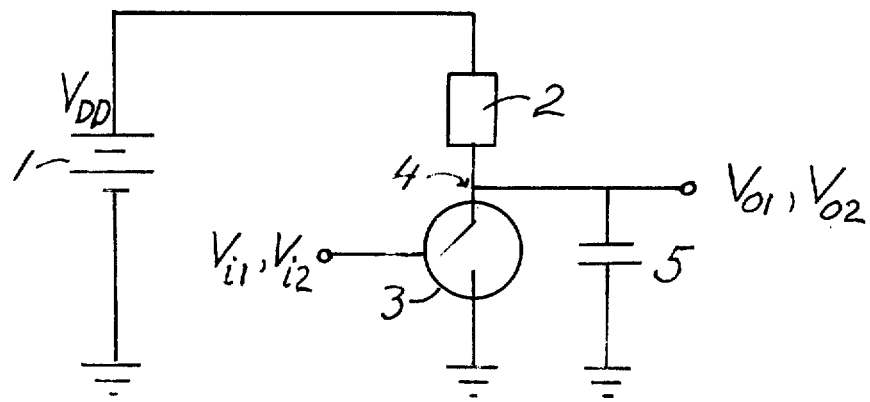
Fig. 1 — prior art
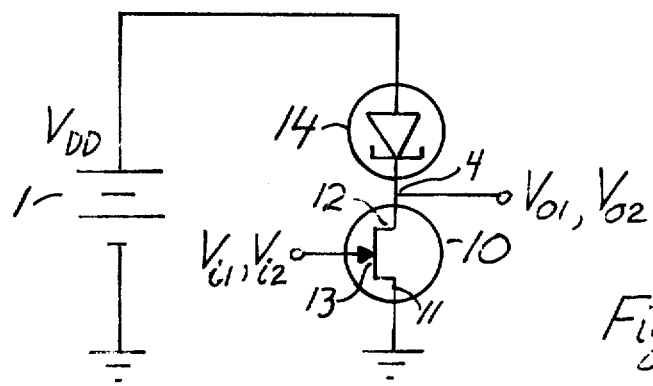
Fig. 2
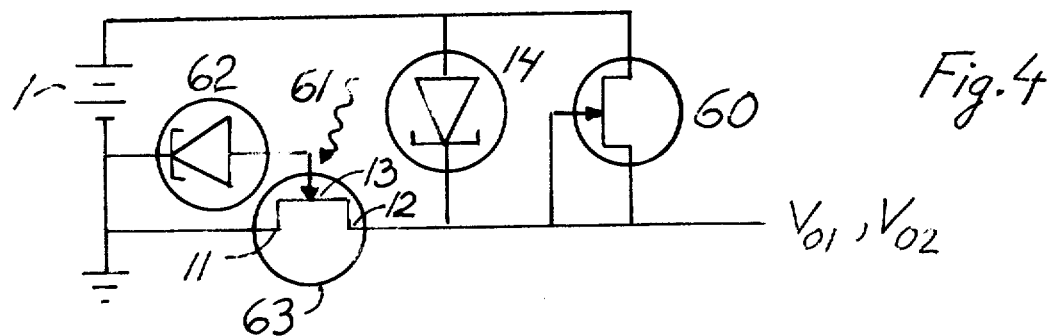
Fig. 4

TUNNEL DIODE LOAD FOR ULTRA-FAST LOW POWER SWITCHING CIRCUITS

BACKGROUND OF THE INVENTION

The basic unit for digital logic circuit operation can be viewed as an inverter comprising a power supply charging a capacitor through a load device in series with a switching device activated by an input signal. The output of the circuit connects to the node between switching device and load device. The aforementioned capacitor is the node capacitance which comprises the switching device capacitance, the input capacitance of the next stage, and parasitic capacitances of the node, such as stray capacitances. With the load device connected to the high terminal of the power supply, and one of the switching device terminals grounded, the capacitor is shorted to ground when the switching device is conducting, and the capacitor is charged to the power supply voltage when the switching device is non-conducting. The stationary current level drawn by the circuit when the switching device is conducting is governed by the power supply voltage and the load resistance. Thus a large load resistance is desirable for achieving low power consumption in this state. When the switching device is turned off, the capacitor charges to the power supply voltage by current flow through the load device. A small load resistance is required to achieve fast switching speed from the on-state to the off-state of the switching device. Thus there are two opposing requirements, a large load resistance for low power consumption, and a small load resistance for fast switching speed, for low power-high speed digital circuits.

These requirements have been met in silicon-based complementary circuits by using as load a second transistor of opposite polarity type, whose resistance is modified by the input signal applied to the switching transistor: the load transistor is turned off when the switching transistor is turned on, and vice versa.

In the quest for higher switching speed, n-channel gallium arsenide field effect transistors have proven superior to silicon transistors because the mobility of electrons in gallium arsenide is larger than that in silicon. Also, the saturation drift velocity of electrons in strong electric fields is larger in gallium arsenide than it is in silicon. Unfortunately the mobility of holes is smaller in gallium arsenide than in silicon, so that complementary gallium arsenide circuitry is unattractive because of the slowness of the p-channel device. Accordingly, ultra-fast gallium arsenide switching circuits have been built using either a fixed resistor load or an n-channel fixed transistor load device. This eliminates the possibility of turning the load device off by the input signal which turns the switching device on, and vice versa. An up-to-date description of gallium arsenide fast switching circuits can be found in several papers in the *Special Issue on Microwave Devices*, No. 6, Vol. ED-25 of the IEEE, *Transactions on Electron Devices*, June 1978, pp. 559–639. The performance of these circuits is being characterized by the speed-power product. The speed of GaAs-transistors is adequate for fast switching of these circuits from the off-state of the transistor to the on-state of the transistor. During this switching the node capacitance is discharged by current flow through the transistor. However, the switching speed of the circuit from the on-state of the transistor to the off-state of the transistor is governed by the charging of the node capacitance through the load device. To achieve high speed at low power, all these circuits face the aforementioned dilemma of the two opposing requirements on the magnitude of the load resistance.

It is an objective of this invention to provide a switching circuit having a load device of large resistance under steady state current flow, but smaller resistance during most of the transient from the on-state with current flow to the off-state without current flow.

It is a further objective of my invention to describe an integrated ultra-high speed switching circuit of low power consumption based on the above-mentioned principle.

It is a further objective of my invention to describe an ultra-fast gallium arsenide integrated switching circuit of low power consumption.

It is a further objective of this invention to describe an ultra-fast gallium arsenide integrated switching circuit activated by a light beam with means for fast recovery after the light beam is switched off.

SUMMARY OF THE INVENTION

The key element of my invention is the use of a tunnel diode for rapid discharging of a capacitor in a switching circuit. The tunnel diode has a low resistance in the tunnel regime at low forward bias voltages, but it has a high resistance at moderately higher forward bias voltages when tunneling through the p-n barrier has ceased, and the ordinary diode current involving carrier transport across that barrier is still quite small. At a steady state input voltage which turns the switching device in a switching circuit on, most of the power supply voltage extends over the tunnel diode load device, which then is in the high resistance state. After the switching device current is turned off by a change in its input voltage, the voltage across the tunnel diode drops, and the diode resistance decreases from the high value in the non-tunnel regime to the low value in the tunnel regime. This provides low power consumption in the steady state when the switching device is turned on, as well as fast switching speed for the transient following the turn-off of the switching device.

The preferred switching device of my invention is an n-channel enhancement mode GaAs field effect transistor. The low power consumption of my circuit is enhanced by using a low supply voltage of the order of only one volt. This voltage level provides a voltage drop of a few tenths of a volt across the switching transistor in its on-state, the remaining several tenths of a volt biasing the tunnel diode to the afore-mentioned high resistance state. Thus the node voltage between the switching transistor and the tunnel diode is a few tenths of a volt when the transistor is turned on and becomes the power supply voltage of about one volt in the steady state when the transistor is turned off. Since this node voltage is the input voltage to the switching device of the next stage, and level shifting is to be avoided, since it affects speed and power consumption adversely, we require a switching transistor which is turned off at a few tenths of a volt input, but turned on by about one volt. Enhancement mode gallium arsenide field effect transistors can be designed to satisfy these requirements. The voltage levels of a properly designed n-channel gallium arsenide enhancement mode field effect transistor are well suited for combination with a gallium arsenide tunnel diode load. Since the drain region of the transistor is heavily doped, a degenerate p+ layer contiguous to a degenerate n$^{30}$ drain region provides the tunnel diode load, integrated with the switching transistor into a compact, simple structure.

The gate forward bias voltage to turn the enhancement mode field effect transistor on can be generated by the photovoltaic effect of an impinging light beam. Recovery of the transistor after the light beam is switched off requires discharge of the gate junction capacitance. The discharge time is reduced by connecting a tunnel diode between gate and source.

BRIEF DESCRIPTION OF THE DRAWINGS

FIG. 1 is a general schematic of a typical switching circuit comprising a power supply, an electronic switch, a load device, and an output load capacitance.

FIG. 2 shows a switching circuit according to this invention, whereby the load resistance is provided by a tunnel diode, and the switch is a junction field effect transistor.

FIG. 4 shows another switching circuit according to my invention whereby the switching transistor is activated by a light beam and a tunnel diode is used for speeding up the recovery of the transistor after the light beam has been switched off.

DESCRIPTION OF PREFERRED EMBODIMENTS

Figure 3:
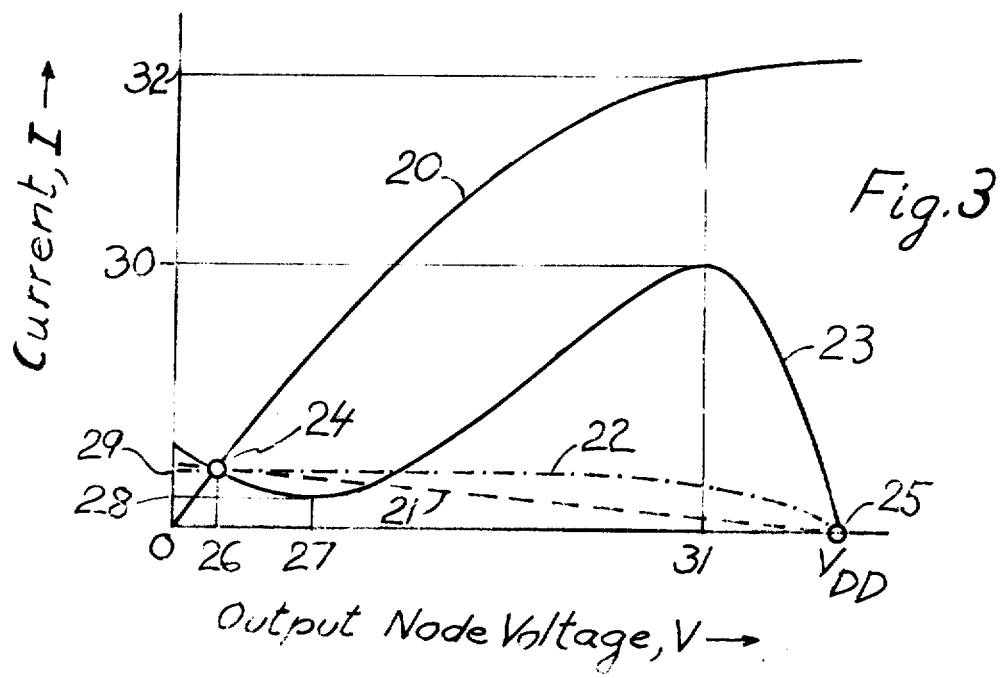
FIG. 3 gives a current-voltage diagram including the current voltage characteristics of the turned-on transistor and load lines for a conventional fixed resistor load, a conventional fixed transistor load, and the tunnel diode load of this invention.

FIG. 1 is a general schematic for a inverter switching circuit which is the basic element of any computer. A power source 1 supplies the voltage $V_{DD}$ over a load device 2 to a switching element 3. The switch 3 is activated electrically by the input voltages $V_{il}$ for closing the switch or $V_{i2}$ for opening the switch. A perfect switch operates instantaneously and has zero resistance when closed and infinite resistance when opened. The resulting steady state output voltages $V_{o1}$ and $V_{o2}$ taken at the node 4 between switch 3 and load 2 are then $V_{o1} = 0$ for $V_{il}$, and $V_{o2} = V_{DD}$ for $V_{i2}$. If these output voltages are the input voltages for the next, identical switching stage, as is desirable in large scale integrated computer circuits, then $V_{il} = V_{o2} = V_{DD}$, and $V_{i2} = -V_{o1} = 0$. The capacitance 5 of the output node 4 comprises the intrinsic capacitances of switch 3 and load 2, parasitic stray capacitances, and the input capacitance of the next stage which is typically the input capacitance of another switch 3.

When the switch 3 is closed the steady state current is $V_{DD}/R$ assuming an ideal switch 3 of zero on-resistance and a fixed resistor load 2 of resistance R. When the switch 3 is opened, the node capacitor 5 of capacitance C charges to $V_{DD}$ by current flow through the load resistor 2 with the time constant RC for the charging current transient. The speed-power product is thus the product of RC and $V_{DD}^2/2R$, which is $CV_{DD}^2/2$, assuming that the switch is half of the time closed, and neglecting dynamic power dissipation. If the switch is activated f times per second, the capacitance C is charged and discharged f times per second, providing the dynamic power dissipation $fCV_{DD}^2/2$. The speed of charging the capacitor is again RC. Thus the dynamic speed-power product is $RCf(CV_{DD}^2/2)$. The switching frequency f is limited to less than $RC^{-1}$ so that the dynamic speed-power product is at most of the same magnitude $CV_{DD}^2/2$ as calculated previously for steady state power dissipation. Thus in order to achieve a small speed-power product, a low supply voltage $V_{DD}$ and a low node capacitance C is required, in addition to a fast switch 3 of low on-resistance and high off-resistance. The resistance R of the load 2 does not affect the speed-power product, since its effects on speed and power consumption proceed in opposite directions and cancel. This cancellation does not occur if the steady state load resistance and the transient load resistance differ. My invention teaches the use of a load device 2 which has a steady state load resistance at closed switch significantly higher than its average load resistance during the transient after the switch is opened, thereby achieving a speed-power product significantly smaller than $CV_{DD}^2/2$.

Referring now to FIG. 2, there is shown a preferred embodiment according to this invention for the basic switching circuit of FIG. 1. The switching element 10 in FIG. 2 is an n-channel enhancement mode gallium arsenide junction field effect transistor. No current flows from source 11 to drain 12 of this device unless a positive input voltage in excess of the threshold voltage $V_T$ is applied to the gate 13. The input voltage $V_{i2}$ applied to gate 13 is chosen smaller than $V_T$, and the input voltage $V_{i1}$ is chosen larger than $V_T$. In the latter case the channel between source 11 and drain 12 becomes conducting. The tunnel diode 14 in FIG. 2 is chosen for the load device 2 of the general circuit of FIG. 1. The advantage of using a tunnel diode as load will be evident from the discussion of the current-voltage diagram FIG. 3 for the circuit of FIG. 2.

Refering now to FIG. 3, abscissa is the output node voltage and ordinate are currents through the switching transistor 10 of FIG. 2 in its on-state and through several load devices including the tunnel diode load 14. The dashed linear load line 21 pertains to a fixed resistor load R and connects the points I = 0, V = $V_{DD}$, and I = $V_{DD}/R$, V = 0. In the steady state the currents through the switching transistor and through the load device are equal, and provide the encircled steady state operating points 24 for the on-state and 25 for the off-state of the transistor. The characteristics of the three load devices have been chosen to provide the same operating points and thus the same steady state power dissipation. However, the switching speed of the circuit differs depending on the choice of the load device since the node capacitance C charges along the load line of the load device. In the case of the fixed resistor load line 21 the charging current decreases with time as the node capacitor becomes increasingly charged, and the node voltage shifts from the voltage 26 pertaining to the operating point 24 to the voltage $V_{DD}$ of the operating point 25. The charging time of the node capacitor is somewhat reduced for the load line 22 of a prior art fixed transistor load, as the charging current remains constant for a considerable range of voltages across the fixed transistor load device. The charging time of the node capacitor is considerably reduced by using the tunnel diode characteristics 23 as load line. This load line exhibits the well-known negative resistance between the node voltages 27 and 31. As the capacitor charges and the voltage across the tunnel diode drops the tunnel diode resistance decreases due to the onset of tunnel conduction and the charging current of the node capacitor increases. Thus the node capacitor acquires its steady state charge much more rapidly along the tunnel diode load line 23 than along the prior art resistor or fixed transistor load lines 21 and 22.

The tunnel diode load line 23 is to be chosen with the following objectives in mind: the output voltage 26 pertaining to the operating point 24 of the transistor in the on-state should be only slightly smaller than the voltage 27 pertaining to the valley current 28 of the tunnel diode. The steady state current 29 pertaining to the operating point 24 is then only slightly larger than the valley current 28 of the tunnel diode, providing low steady state power dissipation. Furthermore, the charging current of the node capacitor then soon rises above the valley current 28 after the switching transistor is switched off, providing a fast charging transient. The peak current 30 of the tunnel diode should be less than the corresponding current 32 of the switching transistor so that the tunnel diode characteristics 23 and the characteristics 20 for the on-state of the switching transistor intersect only at the operating point 24. Similarly, while the transistor current in the low current state must not be exactly zero as pictured in FIG. 3, it must be kept sufficiently small that the tunnel load line 23 is intersected only once, namely in the operating point 25.

The switching time of the circuit is reduced by the use of a tunnel diode load compared to a conventional fixed transistor load by about one half of the ratio of peak current 30 to valley current 28 of the tunnel diode. For gallium arsenide tunnel diodes the peak to valley current ratio is about 12 to 1, according to Chapter 4, FIG. 23 of S. M. Sze, *Physics of Semiconductor Devices*, John Wiley & Sons, New York (1969). Thus my invention provides a speed improvement by about a factor 6 over conventional load devices for switching of the transistor from the on-state to the off-state.

When switching the transistor from the off-state to the on-state, the node capacitor is discharged through the transistor, but some charge flows into the node capacitor through the load device, the net discharge current of the node capacitor being the difference between the current through the switching transistor and the load device. Accordingly, the tunnel diode device somewhat retards the discharge of the node capacitor when the switching transistor is turned on, compared to conventional fixed resistor or fixed transistor load devices. However, there still remains a significant net improvement in the overall switching speed of my circuit, since in conventional circuits the switching time for the transient from the on-state to the off-state of the transistor is considerably longer than the switching time for the transient from the off-state to the on-state of the transistor, and it is the former which is considerably shortened in my circuit while the latter is only moderately prolonged.

The tunnel diode load device contributes significantly to the output node capacitance. Accordingly, the switching speed of the circuit for switching from the on-state of the switching transistor to the off-state becomes substantially that of a tunnel diode switch. For the switching transistor itself, speeds of the order of only 10 picoseconds can be projected.

The load line in the vicinity of the valley point of the tunnel diode characteristic 23 has been modified in the circuit of FIG. 4 by shunting the tunnel diode by a conventional load device, such as the fixed transistor load 60. The field effect transistor switch 63 of FIG. 4 is an enhancement mode junction phototransistor device turned on by the light beam 61 impinging on the gate region 13. The light beam is of a wave length sufficiently short to generate electron hole pairs in the gate junction region thus causing a forward bias voltage of the gate junction by the photovoltaic effect. This forward bias exceeds the threshold voltage and turns the transistor on. The tunnel diode 62 between gate and source serves to discharge the gate rapidly after the incident light beam is switched off thus enhancing the recovery of the phototransistor.

Figure 5:
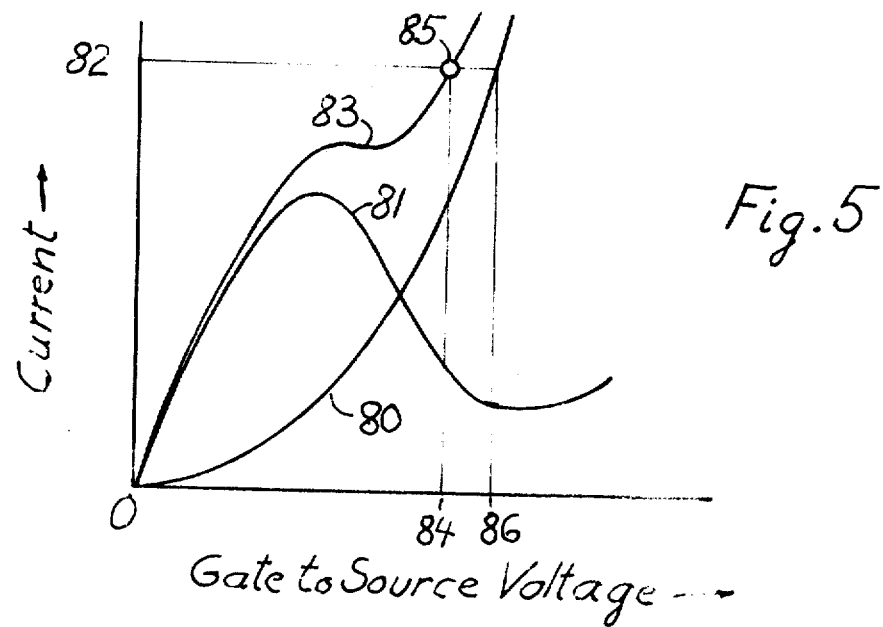
FIG. 5 shows current voltage characteristics for the gate to source diode of the phototransistor in the circuit of FIG. 4 and for the tunnel diode shunting its gate to its source.

FIG. 5 shows the gate to source current voltage characteristic 80 of the enhancement mode junction field effect phototransistor 63 and that, 81, of the tunnel diode 62. The light beam 61 is of such an intensity that it generates an internal photocurrent 82 across the gate junction of the transistor. This current level generates a gate to source voltage 84 corresponding to the intersect 85 with the combined current voltage characteristics 83 of gate junction and tunnel diode. After the light beam is removed, the gate to source voltage returns to zero by discharge of the gate and tunnel diode capacitances by current flow according to the current-voltage path 83. This discharge occurs much more rapidly than if it would occur solely through the gate junction, i.e. according to the current voltage path 80 from the slightly larger voltage 86 in absence of tunnel diode 62.

Figure 6:
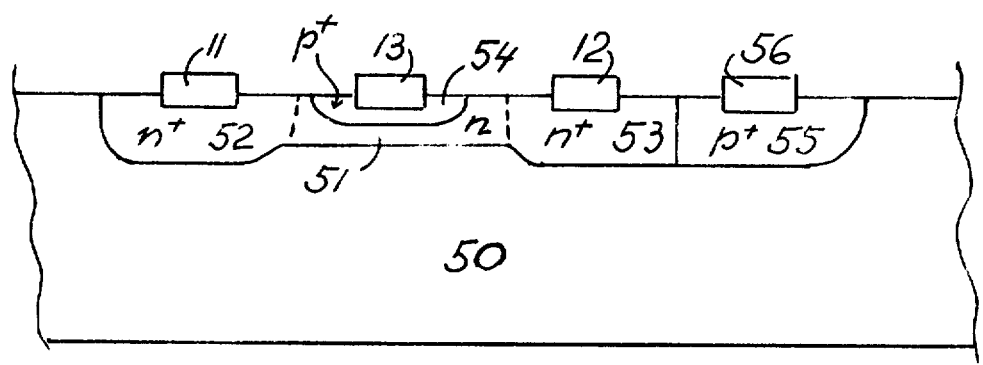
FIG. 6 shows a cross-section through an integrated structure according to this invention for realization of the circuit of FIG. 2.

FIG. 6 shows a cross section through an integrated gallium arsenide structure according to my invention. This structure realizes the circuit of FIG. 2. FIG. 6 comprises a semi-insulating gallium arsenide substrate 50, about 10 mils thick, which carries at its upper surface a lightly doped thin n-type layer 51 which is terminated by heavily doped n+-type source and drain regions 52 and 53. The surface of the n-layer 51 is overlaid by a p+-gate region 54. Source, drain, and gate regions are provided with ohmic contacts 11, 12 and 13, using known gold-germanium alloying procedures. The channel length of the n-layer 51 between source 52 and drain 53 is of the order of a micron. The regions 51-54 with contacts 11-13 represent a conventional high frequency enhancement mode junction field effect transistor of the design and manufacturing procedure described in "Femto-Joule High Speed Planar Gallium Arsenide E-JFET Logic" by R. Zuleeg, J. K. Notthoff, and K. Lehovec, published in the IEEE *Transactions on Electron Devices*, Vol. ED-25, No. 6, June 1978, pp. 628–639. A heavily doped degenerate p+ region 55 is arranged contiguous to the degenerate n+ drain region 53. These p+ and n+ regions provide the tunnel diode load device 14 of FIG. 2. The ohmic contact 56 to region 55 is to be connected to the positive terminal of the power supply and the source contact 11 is to be grounded. The gate contact 13 is to be connected to the input voltage of the switching circuit and the drain contact 12 is the output contact 4 of the switching circuit of FIG. 2. A typical power supply voltage is about 1 volt, of which 0.7 volt extends across the tunnel diode, and 0.3 volt extends across the transistor when it is switched on by an input voltage of 1 volt. The threshold voltage of the transistor is chosen to be slightly larger than 0.3 volt, so that the transistor is not yet turned on by the input voltage of 0.3 volt.

Figure 7:
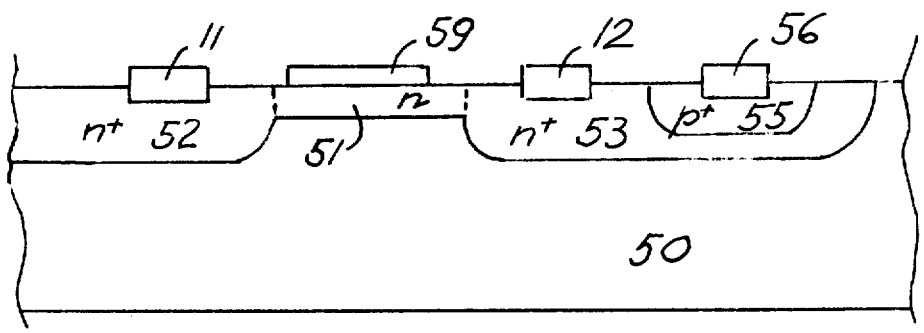
FIG. 7 shows a cross-section through another integrated structure according to this invention for realization of the circuit of FIG. 2.

FIG. 7 shows another preferred embodiment of this invention which differs from the structure in FIG. 6 by the p+ region 55 in FIG. 7 being completely surrounded by the n+ drain region 53. The switching transistor in this structure is an enhancement-mode Schottky barrier field effect transistor, i.e. the p+ gate layer 54 and electrode 13 of the structure of FIG. 6 have been replaced by an aluminum barrier electrode 59.

Figure 8:
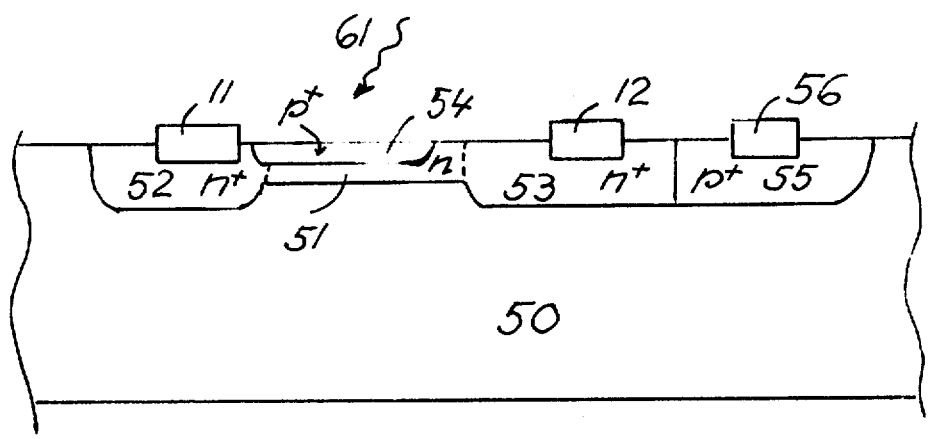
FIG. 8 shows a cross-section through an integrated structure according to this invention for realization of the circuit of FIG. 4.

FIG. 8 shows a cross-section through an integrated structure which realizes the circuit of FIG. 4 without fixed transistor load 60. The fixed transistor load 60 is not necessary for operation of the circuit, but has been added in FIG. 4 to demonstrate a possible circuit variation. The phototransistor 63 of FIG. 4 differs from the switching transistor 10 of FIG. 2 in that the gate contact 13 of FIG. 6 is omitted and the p+ gate layer 54 is extended to be contiguous with the n+ source region 52. The tunnel diode 62 of FIG. 4 comprises the degenerate n+ source region 52 and the degenerate p+ gate region 54.

Many variations of my invention will be obvious to those skilled in the art. Thus my invention should not be limited by the preferred embodiments here described, but encompasses all solid state circuits characterized by the following claims.

I claim:

1. A switching circuit comprising a field effect transistor, means for applying at least two input voltages to the gate of said field effect transistor, whereby source-to-drain resistance of said transistor is low for a first of said input voltages, and high for a second of said input voltages, the drain of said field effect transistor electrically connected through a tunnel diode load to a power supply voltage which biases said tunnel diode in the forward direction, said power supply voltage chosen such that the current flowing through said tunnel diode is substantially less than the peak current of said tunnel diode and only moderately larger than the valley current of said tunnel diode when said first input voltage is applied, said first input voltage being sufficiently large and said second input voltage being sufficiently small so that the current-voltage characteristic of said field effect transistor for each of said field and second input voltages intersects the current-voltage load line of said tunnel diode only once, the output terminal of said switching circuit being the node between said field effect transistor and said tunnel diode.

2. The circuit of claim 1 whereby said field effect transistor is an n-channel gallium arsenide field effect transistor having a degenerate n+ drain region contiguous to a degenerate p+ region, the junction between n+ and p+ regions constituting the junction of said tunnel diode.

3. The circuit of claim 2 whereby said p+ and n+ regions are laterally adjacent to each other along a gallium arsenide surface with said junction extending substantially perpendicular to said surface.

4. The circuit of claim 2 whereby the major area of said junction extends substantially parallel to said surface.

5. The circuit of claim 1 whereby said field effect transistor is a junction field effect transistor.

6. The circuit of claim 1 whereby said field effect transistor is a Schottky barrier field effect transistor.

7. The circuit of claim 1 whereby said first input voltage is an electric potential applied to the gate of said field effect transistor and having a magnitude above the threshold voltage of said transistor, and said second input voltage is an electric potential applied to said gate and having a magnitude below said threshold voltage.

8. A direct coupled inverter circuit comprising an enhancement mode field effect transistor, means to apply at least two different input signals to the gate of said transistor, whereby the source-to-drain resistance of said transistor is lower for a first of said input signals, and is higher for a second of said input signals, the drain of said transistor in series with a load having a negative resistance over a limited voltage range, said load in series with said transistor connected to a power source, the output terminal of said inverter circuit being the node between said transistor and said load whereby at least one of said input signals is generated by a light beam.

9. An integrated gallium arsenide structure comprising a semi insulating gallium arsenide substrate, an enhancement mode n-channel field effect transistor at one surface of said substrate, portions of the n-drain region of said transistor representing the n-region of a tunnel diode, said tunnel diode comprising a p-region contiguous with said n-region, a first second, third and fourth contact to the source, gate and drain regions of said transistor, and to the p-region of said tunnel diode, respectively, means to apply a positive power supply voltage between said fourth and first contacts, means to apply a first and a second potential between said second and said first contacts, said first potential being more positive than said second potential, the steady state transistor current when said first potential is applied being only slightly larger than the valley current of said tunnel diode and substantially less than the peak current of said tunnel diode, the voltage across said tunnel diode when said first potential is applied being only slightly larger than the voltage across said tunnel diode at its valley current, and the steady state transistor current when said second potential is applied being less than the valley current of said tunnel diode.

10. An integrated structure comprising an enhancement mode field effect transistor means to charge the gate of said field effect transistor to a potential, a tunnel diode connected between said gate and the source of said field effect transistor whereby said gate discharges rapidly through said tunnel diode when said means to charge said gate is removed.

11. The integrated structure of claim 10 whereby said means to charge said gate of said enhancement mode field effect transistor includes an impinging light beam.

12. The integrated structure of claim 10 whereby said enhancement mode field effect transistor is an n-channel gallium arsenide junction field effect transistor, said gate is a degenerately doped p+-GaAs region, said source a degenerately doped n+-GaAs region, said n+ source region contiguous with said p+-gate, region said tunnel diode comprising the junction between said p+-gate and n+-source regions.

13. A forward biased tunnel diode in series connection with a network containing at least one field effect transistor, said tunnel diode and network connected to a power supply, the voltage of said power supply being only moderately larger than the voltage across said tunnel diode pertaining to the valley current of said tunnel diode, means for changing the gate voltage of said field effect transistor, thereby changing the current through said network and tunnel diode, said current including a first current value and a second current value, the steady state voltage across said tunnel diode at said first current value being less than the voltage across said tunnel diode pertaining to the peak current of said tunnel diode, the steady state voltage across said tunnel diode at said second current value being only moderately larger than the voltage pertaining to said valley current, and said second current value therefore being only moderately larger than said valley current and substantially lower than said peak current.

* * * * *